(12) United States Patent
Ohsumi

(10) Patent No.: US 8,304,663 B2
(45) Date of Patent: Nov. 6, 2012

(54) WIRING BOARD AND MANUFACTURING METHOD THEREOF

(75) Inventor: Kohichi Ohsumi, Yasu (JP)

(73) Assignee: KYOCERA SLC Technologies Corporation, Shiga (JP)

( * ) Notice: Subject to any disclaimer, the term of this patent is extended or adjusted under 35 U.S.C. 154(b) by 816 days.

(21) Appl. No.: 12/155,151

(22) Filed: May 30, 2008

(65) Prior Publication Data

US 2008/0302563 A1   Dec. 11, 2008

(30) Foreign Application Priority Data

May 31, 2007 (JP) ................................. 2007-146108

(51) Int. Cl.
*H05K 1/16* (2006.01)
(52) U.S. Cl. ........................................ 174/260; 174/263
(58) Field of Classification Search .......... 174/260–263, 174/257, 258; 361/760, 774; 257/777, E23.141, 257/668
See application file for complete search history.

(56) References Cited

U.S. PATENT DOCUMENTS

| | | | |
|---|---|---|---|
| 7,915,718 B2* | 3/2011 | Lee et al. | 257/668 |
| 2006/0012967 A1* | 1/2006 | Asai et al. | 361/764 |
| 2009/0057919 A1* | 3/2009 | Lin et al. | 257/777 |

FOREIGN PATENT DOCUMENTS

| | | |
|---|---|---|
| JP | 01-143392 | 6/1989 |
| JP | 06-152114 | 5/1994 |
| JP | 07-022735 | 1/1995 |
| JP | 09-023054 | 1/1997 |
| JP | 3420076 | 4/2003 |
| JP | 2006-344664 | 12/2006 |
| JP | 2006344664 | * 12/2006 |
| JP | 2007-096291 | 4/2007 |

* cited by examiner

*Primary Examiner* — Yuriy Semenenko
(74) *Attorney, Agent, or Firm* — Clark & Brody

(57) ABSTRACT

In a wiring board, insulation layers and wiring conductors are alternately laminated, and a plurality of strip-shaped wiring conductors for connecting semiconductor elements are arranged side by side on the outermost insulation layer. Each of the wiring conductors partly has a connection pad to which the electrode terminals of the semiconductor elements are connected by flip-chip bonding. In the wiring board, a solder resist layer is deposited over the outermost insulation layer and the strip-shaped wiring conductors so as to have slit-shaped openings for exposing the upper surfaces of the connection pads. The solder resist layer fills up the space between the connection pads adjacent to each other and exposed within the slit-shaped openings.

4 Claims, 12 Drawing Sheets

(a)

(b)

(c)

(d)

(e)

(a)

(b)

WIRING BOARD AND MANUFACTURING METHOD THEREOF

Priority is claimed to Japanese Patent Application No. 2007-146108 filed on May 31, 2007, the disclosure of which is incorporated by reference in its entirety.

BACKGROUND OF THE INVENTION

1. Field of the Invention

The present invention relates to a wiring board and a manufacturing method thereof. More particularly, the present invention relates to a wiring board and a manufacturing method thereof which are suitable for mounting, for example, peripheral pad type semiconductor integrated circuit elements by flip-chip bonding.

2. Description of Related Art

Examples of semiconductor integrated circuit elements of related art include so-called peripheral pad type semiconductor integrated circuit elements with a large number of electrode terminals arranged along the outer periphery of one major surface thereof. An example of the method of mounting these semiconductor integrated circuit elements on a wiring board is a flip-chip bonding method. In the flip-chip bonding method, firstly, part of wiring conductors for connecting semiconductor elements mounted on a wiring board is exposed correspondingly to the arrangement of the electrode terminals of the semiconductor integrated circuit elements. Secondly, the exposed part of the wiring conductors for connecting the semiconductor elements is opposed to the electrode terminals of the semiconductor integrated circuit elements, and then electrically connected to each other through, for example, solder bumps.

As shown in FIGS. 12-14, a wiring board 120 of related art (designated as prior art in the drawings) has a core insulation layer 103 provided with a core wiring conductor 102 extending over the upper and lower surfaces thereof. Buildup insulation layers 104 and buildup wiring conductors 105 are laminated alternately one upon another on the upper and lower surfaces of the core insulation layer 103. A solder resist layer 106 is deposited over the uppermost surface of the laminate.

A plurality of through-holes 107 extend between the upper and lower surfaces of the core insulation layer 103. The core wiring conductor 102 is deposited over the upper and lower surfaces of the core insulation layer 103 and the inner surfaces of these through-holes 107. A resin filler 108 fills the inside of these through-holes 107. A plurality of via holes 109 are formed in the buildup insulation layers 104, respectively. Buildup wiring conductors 105 are formed by deposition on the surfaces of the buildup insulation layers 104 and the inner surfaces of the via holes 109, respectively.

The part of these buildup wiring conductors 105, which is deposited over the buildup insulation layer 104 as the outermost layer on the upper side of the wiring board 120, constitutes wiring pattern portions 105A. These wiring pattern portions 105A are strip-shaped-wiring conductors partly having connection pads 105a for connecting semiconductor elements, which are electrically connected through solder bumps 110 to the electrode terminals of the semiconductor integrated circuit elements 101 by flip-chip bonding. A plurality of the wiring pattern portions 105A are arranged side by side in the shape of a strip.

Among these wiring pattern portions 105A, the semiconductor element connection pads 105a are arranged side by side and exposed from the solder resist layer 106. Electrode terminals 101a of the semiconductor integrated circuit elements 101 are electrically connected through the solder bumps 110 to the exposed connection pads 105a.

On the other hand, the part of these buildup wiring conductors 105, which is deposited on the buildup insulation layer 104 as the outermost layer on the lower side of the wiring board 120, constitutes wiring pattern portions 105B. These wiring pattern portions 105B have connection pads 105b for external connection to be electrically connected to the wiring conductor of an external electrical circuit board. A plurality of the wiring pattern portions 105B are arranged side by side. Among these wiring pattern portions 105B, the connection pads 105b for external connection are exposed from the solder resist layer 106. The wiring conductor of the external electrical circuit board is electrically connected through solder balls 111 to the exposed connection pads 105a.

The solder resist layer 106 protects the outermost buildup wiring conductor 105 and defines the connection pads 105a for connecting semiconductor elements and the external connection pads 105b. The solder resist layer 106 can be formed by laminating thermosetting resin paste or film having photosensitivity on the outermost buildup insulation layer 104 provided with the buildup wiring conductor 105, and carrying out exposure and development so as to have openings for exposing the connection pads 105a and 105b, followed by curing.

As shown in FIGS. 13 and 14, the solder resist layer 106 on the upper side has slit-shaped openings 106a for collectively exposing the plurality of side-by-side arranged connection pads 105a. The connection pads 105a in a rectangular shape are defined by partially exposing the wiring pattern portions 105A in the length corresponding to the width of the openings 106a.

In mounting the semiconductor integrated circuit elements on the wiring board 120 thus configured, firstly, the solder bumps 110 are preformed at the connection pads 105a in order to bring about the engagement between the electrode terminals 101a of the semiconductor integrated circuit elements 101 and the solder bumps 110. Subsequently, the solder bumps 110 are melted by heating, so that the electrode terminals 101a of the semiconductor integrated circuit elements 101 and the connection pads 105a are electrically connected to each other through the solder bumps 110. Thereafter, the semiconductor integrated circuit elements 101 are mounted on the wiring board 120 by applying underfill resin (not shown) composed of thermosetting resin such as epoxy resin into the space between the semiconductor integrated circuit elements 101 and the wiring board 120.

Hereat, to form the solder bumps 110 on the connection pads 105a, in general, paste-like or granular solder is adhered to the surfaces of the connection pads 105a exposed from the solder resist layer 106. This is then heated to melt the solder, so that the melted solder is wet-spread over the exposed surfaces of the connection pads 105a, and solder droplets are formed on the connection pads 105a by the surface tension of the melted solder.

Meanwhile, owing to the recent rapid high integration of the semiconductor integrated circuit elements 101, the pitch between the electrode terminals 101a in the semiconductor integrated circuit elements 101 has become extremely narrow (for example, 50 μm or less). The pitch between the connection pads 105a to which the electrode terminals 101a of the semiconductor integrated circuit elements 101 are connected by flip-chip bonding is correspondingly narrowed (for example, 50 μm or less). Further, there are also demands for an extremely narrow width W1 of the connection pads 105a (for example, 25 μm or less) and for an extremely narrow space W2 between the adjacent connection pads 105a (for example, 25 μm or less) (refer to FIG. 14).

The narrow space W2 between the adjacent connection pads 105a causes the following problem. That is, in the above-mentioned manner that the paste-like or the granular solder is adhered onto the surfaces of the connection pads 105a, and the solder is melted by heating, the melted solder is liable to be connected to the side surfaces of the adjacent connection pads 105a. This causes an electrical short circuit between the adjacent connection pads 105a, making it impossible to perform the normal operation of the mounted semiconductor integrated circuit elements 101.

For example, Japanese Patent No. 3420076 describes the board manufacturing method including the steps of forming solder bumps on connection pads having a large width by continuously forming wiring patterns and the connection pads, the wiring patterns having a smaller width dimension than the connection pads, and exposing the connection pads and the wiring patterns from solder resist, and then adhering the solder onto the exposed connection pads and the exposed wiring patterns, followed by heating to melt the solder. There is a description that this method ensures the formation of the solder bumps on the connection pads having a pitch of 70 to 120 μm.

For further reduction of the pitch between the connection pads (for example, 50 μm or less), even with the above-mentioned method described in Japanese Patent No. 3420076, the melted solder tends to be connected to the side surfaces of the adjacent connection pads, which may cause an electrical short circuit between the adjacent connection pads.

It can be considered that the solder resist layer 106 having independent openings corresponding to a plurality of side-by-side arranged connection pads 105a is disposed so as to individually expose these connection pads 105a. However, when the pitch between the connection pads 105a is narrow and the space between the adjacent connection pads 105a is extremely narrow, it is extremely difficult that the openings for exposing the plurality of side-by-side arranged connection pads 105a with high position accuracy are independently disposed so as to correspond to these connection pads 105a, respectively.

The present applicant has proposed, in Japanese Unexamined Patent Publication No. 2006-344664, the wiring board in which conductive projections, to which the electrode terminals of semiconductor elements are flip-chip bonded, are disposed at a part on strip-shaped wiring conductors for connecting the semiconductor elements, and a solder resist layer is deposited so as to expose the upper surfaces of these conductive projections. In this wiring board, the solder resist layer fills up the space between the adjacent conductive projections, and the side surfaces of these conductive projections are not exposed largely. This suppresses that even when solder bumps are disposed on these conductive projections, the solder is spread over the space between the side surfaces of the adjacent conductive projections.

However, for the wiring board proposed in the above Publication No. 2006-344664, it is necessary to additionally form the conductive projections on the part of the strip-shaped wiring conductors for connecting the semiconductor elements. There remains the problem that the manufacturing steps thereof are complicated and the manufacturing cost thereof is increased.

SUMMARY OF THE INVENTION

One advantage of the invention is to provide a wiring board of high-density wiring having excellent electrical connection reliability as well as a manufacturing method thereof, which enable to properly form solder bumps on individual connection pads for connecting semiconductor elements, without causing any electrical short circuit due to the solder between the adjacent connection pads, thus enabling to surely electrically connect the narrow-pitch electrode terminals of semiconductor integrated circuit elements and the corresponding connection pads.

The intensive research of the present inventor has led to the present invention based on the following new finding. That is, a solder resist layer is deposited so as to fill up the space between the adjacent connection pads exposed within the slit-shaped openings of the solder resist layer, so that the solder is adhered onto these connection pads. The solder is then melted by heating. At this time, the solder is rejected by the surface of the solder resist layer, thereby enabling solder bumps to be properly formed on the individual connection pads, without causing any electrical short circuit due to the solder between the adjacent connection pads for connecting semiconductor elements. This achieves the wiring board of high-density wiring having excellent electrical connection reliability, which is capable of surely electrically connecting the narrow-pitch electrode terminals of semiconductor integrated circuit elements and the corresponding connection pads.

Specifically, the wiring board of the invention includes alternately laminated insulation layers and wiring conductors, a plurality of strip-shaped wiring conductors for connecting semiconductor elements, arranged side by side on the outermost insulation layer, each wiring conductor partly having a connection pad to which the electrode terminals of the semiconductor elements are connected by flip-chip bonding; and a solder resist layer deposited over the outermost insulation layer and the strip-shaped wiring conductors so as to have slit-shaped openings for exposing the upper surfaces of the connection pads. The solder resist layer fills up the space between the connection pads adjacent to each other and exposed within the slit-shaped openings.

One method of manufacturing a wiring board of the invention includes the steps of: alternately laminating insulation layers and wiring conductors; arranging side by side, on the outermost insulation layer, a plurality of strip-shaped wiring conductors for connecting semiconductor elements, each wiring conductor partly having a connection pad to which the electrode terminals of the semiconductor elements are connected by flip-chip bonding; depositing a solder resist layer over the entire upper surfaces of the outermost insulation layer and the strip-shaped wiring conductors; and removing the solder resist layer extending over the connection pads and between the adjacent connection pads so that the upper surfaces of the connection pads are exposed and the solder resist layer remains between the connection pads.

Other method of manufacturing a wiring board of the invention includes the steps of: alternately laminating insulation layers and wiring conductors; arranging side by side, on the outermost insulation layer, a plurality of strip-shaped wiring conductors for connecting semiconductor elements, each wiring conductor partly having a connection pad to which the electrode terminals of the semiconductor elements are connected by flip-chip bonding; depositing a first solder resist layer over the entire upper surfaces of the outermost insulation layer and the strip-shaped wiring conductors; removing the first solder resist layer so that the upper surfaces of the strip-shaped wiring conductors are exposed and the first solder resist layer remains between the adjacent connection pads; and depositing, over the upper surfaces of the first solder resist layer and the strip-shaped wiring boards, a second solder resist layer having slit-shaped openings for exposing the connection pads and the first solder resist layer extending between the adjacent connection pads.

In accordance with the invention, the solder resist layer is deposited so as to fill up the space between the adjacent connection pads exposed within the slit-shaped openings of the solder resist layer. The wettability on the connection pads is higher than the wettability on the solder resist layer. Therefore, when the solder is adhered onto the connection pads and then melted by heating, even if the melted solder is spread over the space between the adjacent connection pads, the melted solder is rejected by the surface of the solder resist layer, and the solder bumps are formed on the connection pads. This produces the effect of providing the wiring board of high-density wiring having excellent electrical connection reliability which enables to properly form the solder bumps on the individual connection pads for connecting semiconductor elements, without causing any electrical short circuit due to the solder between the adjacent connection pads, thereby ensuring the electrical connection between the narrow-pitch electrode terminals of the semiconductor integrated circuit elements and the corresponding connection pads.

DETAILED DESCRIPTION OF PREFERRED EMBODIMENTS

Figure 1:
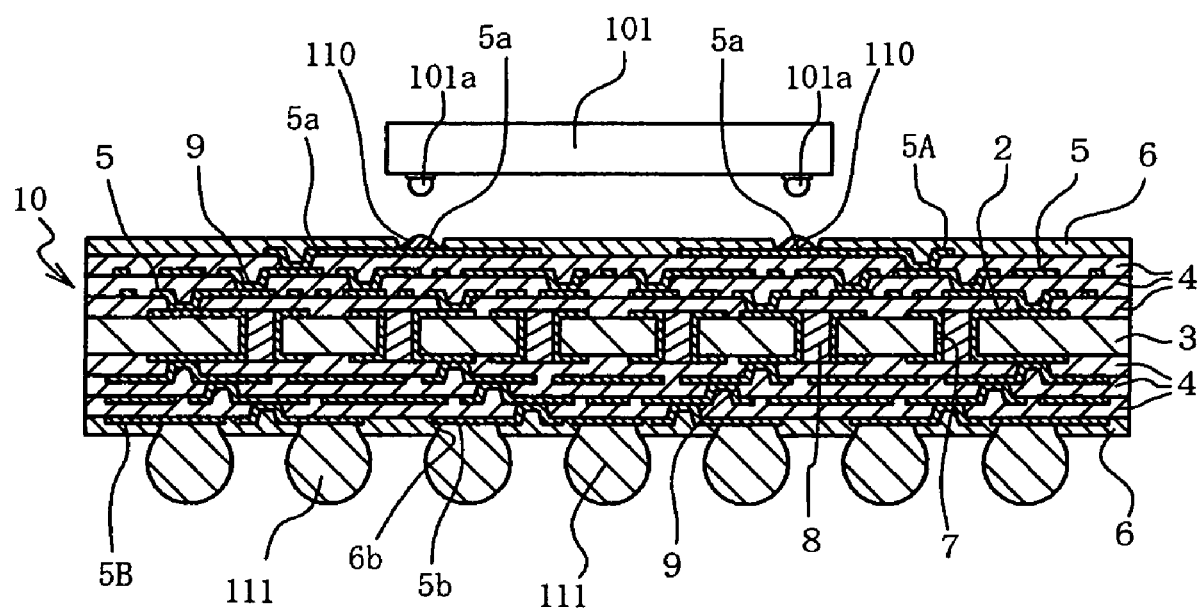
FIG. 1 is a schematic sectional view of a wiring board according to a first preferred embodiment of the invention.
Figure 2:
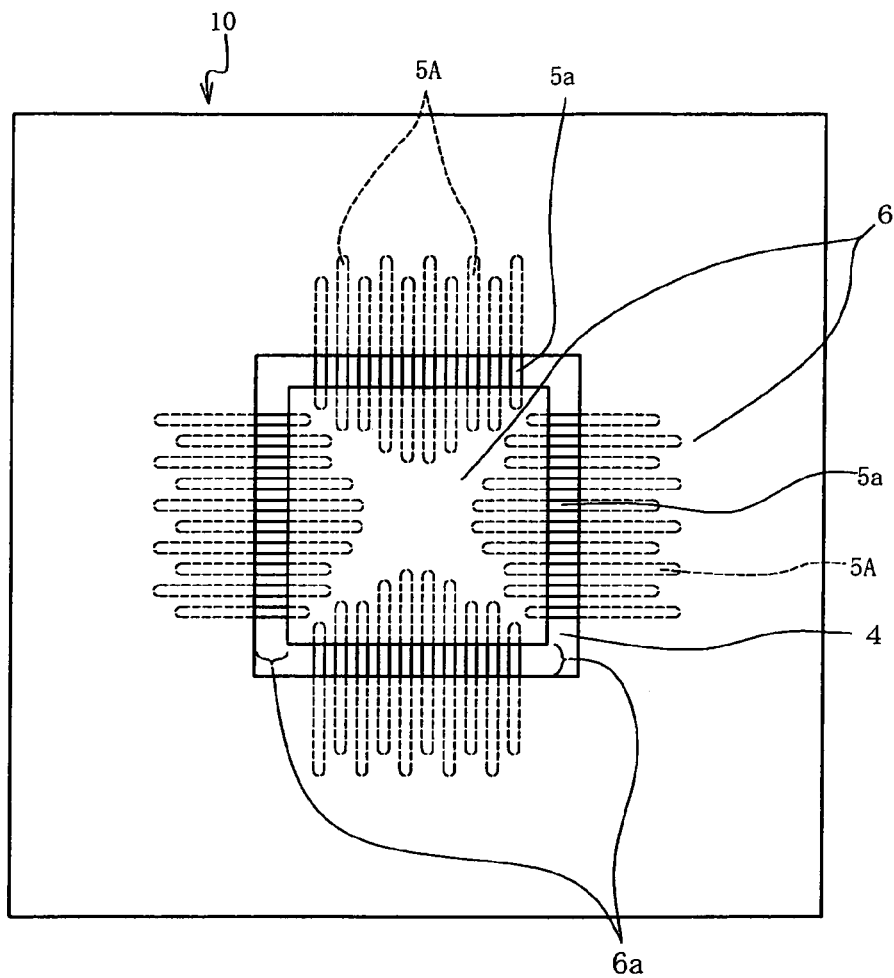
FIG. 2 is a plan view of the wiring board of FIG. 1.

A first preferred embodiment of the wiring board and the manufacturing method thereof according to the invention will be described in detail with reference to the accompanying drawings. As shown in FIGS. 1 and 2, a wiring board 10 of the present embodiment has a core insulation layer 3 provided with core wiring conductors 2 extending over the upper and lower surfaces of the core insulation layer 3. Buildup insulation layers 4 and buildup wiring conductors 5 are laminated alternately one upon another on the upper and lower surfaces of the core insulation layer 3. Protective solder resist layer 6 is deposited on the outermost surfaces of the laminate.

The core insulation layer 3 has a thickness of approximately 0.3 to 1.5 mm, and functions as the core material of a wiring board 10. For example, the core insulation layer 3 is composed of an electrically insulation material made by immersing thermosetting resin such as bismaleimide triazine resin or epoxy resin into a glass cloth formed of vertically and laterally woven glass fiber fluxes.

A plurality of through-holes 7 having a diameter of approximately 0.05 to 0.3 mm extend between the upper and lower surfaces of the core insulation layer 3. The core wiring conductors 2 are deposited on the upper and lower surfaces of the core insulation layer 3 and over the inner surfaces of the through-holes 7. Preferably, the portions of the core wiring conductors 2 corresponding to the upper and lower surfaces of the core insulation layer 3 are formed of copper foil or the like, and the portions of the core wiring conductors 2 corresponding to the inner surfaces of the through-holes 7 are formed of electroless copper plating and the overlying electrolytic copper plating.

Resin filler 8 composed of thermosetting resin such as epoxy resin fills the inside of the through-holes 7. The core wiring conductors 2 formed on the upper and lower surfaces of the core insulation layer 3 are electrically connected to each other through the core wiring conductors 2 within the through-holes 7.

The core insulation layer 3 can be formed by laminating copper foils for the core wiring conductors 2 onto the upper and lower surfaces of a sheet made by, for example, immersing uncured thermosetting resin into a glass cloth, and thermosetting the sheet, and then applying drill processing for the through-holes 7 on the upper and lower surfaces of the sheet.

The core wiring conductors 2 can be formed in the following manner, for example. Firstly, copper foils having a thickness of approximately 3 to 50 μm are laminated over the upper and lower surfaces of the sheet for the core insulation layer 3, as described above, and the through-holes 7 are formed by drilling these copper foils and the core insulation layer 3. Subsequently, electroless copper plating and electrolytic copper plating are applied sequentially to the inner surfaces of these through-holes 7 and the surfaces of the copper foils. The inside of the through-holes 7 are then filled with the resin filler 8. Thereafter, the copper foils and the copper plating on the upper and lower surfaces are etched in a predetermined pattern by using photolithography technique or the like. As a result, the core wiring conductors 2 are formed on the upper and lower surfaces of the core insulation layer 3 and in the inner surfaces of the through-holes 7.

The resin filler 8 fills up the through-holes 7, enabling the buildup insulation layer 4 to be formed immediately above and immediately below the through-holes 7. The resin filler 8 can be formed by applying, for example, uncured paste-like thermosetting resin into the through-holes 7 by screen printing method or the like, and thermosetting the resin and then polishing the upper and lower surfaces thereof so as to be substantially flat.

Each of the buildup insulation layers 4 laminated on the upper and lower surfaces of the core insulation layer 3 has a thickness of approximately 20 to 60 μm.

Like the core insulation layer 3, the buildup insulation layers 4 are composed of an electrical insulation material made by immersing thermosetting resin into a glass cloth, or an electrical insulation material made by dispersing inorganic filler such as silicon oxide into thermosetting resin such as epoxy resin. A plurality of via holes 9 having a diameter of approximately 30 to 100 μm are formed in the individual buildup insulation layers 4.

Buildup wiring conductors 5 composed of electroless copper plating, and the overlying electrolytic copper plating are formed by deposition on the surfaces of the individual buildup insulation layers 4 and the inner surfaces of the via holes 9. High density wiring can be formed in three dimensions by electrically connecting, through the buildup wiring conductors 5 within the via holes 9, the overlying wiring conductor 5 and the underlying wiring conductor 5 with the buildup insulation layer 4 in between.

Part of the wiring conductor 5, deposited on the outermost buildup insulation layer 4 on the upper surface of the wiring board 10, constitutes first wiring pattern portions 5A. A plurality of the first wiring pattern portions 5A are arranged side by side in the shape of a strip, each being a strip-like wiring conductor partly having a connection pad 5a for connecting a semiconductor element to be electrically connected through a solder bump 110 to an electrode 101a of a semiconductor integrated circuit element 101. Part of the wiring conductor 5, deposited on the outermost buildup insulation layer 4 on the lower surface of the wiring board 10, constitutes second wiring pattern portions SB. A plurality of the second wiring pattern portions SB are arranged side by side, each having a connection pad 5b for external connection to be electrically connected through a solder ball 111 to the wiring conductor of an external electric circuit board.

These buildup wiring conductors 5 can be formed by, for example, a so-called semi-additive method. In the semi-additive method, for example, a base metal layer for electrolytic plating is firstly formed by electroless copper plating on the surfaces of the buildup insulation layers 4 provided with the via holes 9. Then, a plating resist layer having openings corresponding to the buildup wiring conductors 5 is formed thereon. Subsequently, the buildup wiring conductors 5 are formed by applying electrolytic copper plating onto the base metal layer exposed from the openings by using the base metal layer as the electrode for supplying voltage. After removing the plating resist, the exposed base metal layer is etched away to electrically isolate these buildup wiring conductors 5 from each other.

Nickel plating and gold plating may be deposited sequentially by electroless plating method, electrolytic plating method and the like, or alternatively a solder layer may be deposited on the upper surfaces of the connection pad 5a and the upper surfaces of the connection pad 5b, which are exposed from the solder resist layer 6, in order to prevent them from being oxidized or corroded and improve connections with the solder bumps 110 and the solder balls 111.

As shown in FIG. 2, a plurality of the first wiring pattern portions 5A are arranged side by side in the shape of a strip at a predetermined pitch, at positions corresponding to the outer peripheral parts of the semiconductor integrated circuit element 101 so as to extend perpendicular to the outer peripheral sides of the semiconductor integrated circuit element 101. Each of the first wiring pattern portions 5A has the connection pad 5a for connecting a semiconductor element at a position corresponding to the electrode terminal 101a of the semiconductor integrated circuit element 101. The solder bumps 110, electrically connecting by flip-chip bonding the electrode terminals 101a of the semiconductor integrated circuit element 101, are formed on the connection pad 5a.

The solder resist layer 6 is deposited over the outermost buildup insulation layer 4 and the buildup wiring conductor 5 overlying the buildup insulation layer 4. The solder resist layer 6 is protection film for protecting the outermost buildup wiring conductor 5 against heat and the external environment. The solder resist layer 6 disposed on the upper side has slit-shaped openings 6a for collectively exposing the connection pad 5a. The connection pad 5a in a rectangular shape is defined by partially exposing the first wiring pattern portions 5A in the length corresponding to the width of the openings 6a. A plurality of the connection pads 5a are exposed in their laterally arranged state from the openings 6a of the solder resist layer 6. On the other hand, the solder resist layer 6 disposed on the lower side is deposited so as to have circular openings 6b for exposing the connection pads 5b for external connection.

Figure 3:
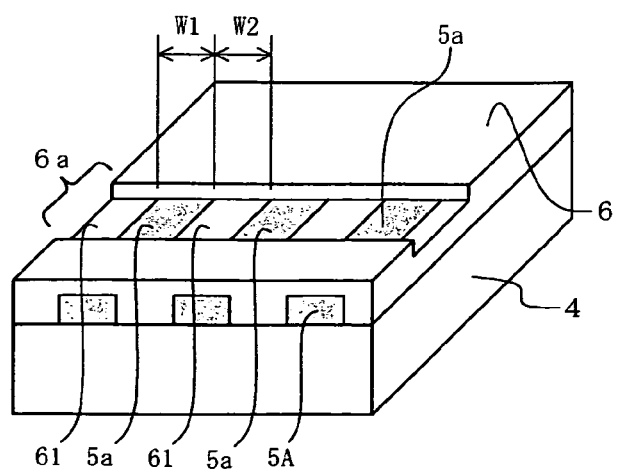
FIG. 3 is a partially enlarged schematic explanatory drawing showing the vicinity of connection pads of the wiring board of the first preferred embodiment.

As shown in FIG. 3, the solder resist layer 6 is deposited so as to fill up the space between the adjacent connection pads 5a exposed within the slit-shaped openings 6a. This enables the solder bumps 110 to be properly formed on the individual connection pads 5a. That is, the solder bumps 110 are formed on the connection pads 5a by using, for example, the following method in which paste-like or granular solder is adhered onto the surfaces of the connection pad 5a exposed from the solder resist layer 6, and then heated to melt the solder.

Since the solder resist layer 6 are deposited so as to fill up the space between the adjacent connection pads 5a, the heat-melting the solder after being adhered onto the connection pads 5a causes no electrical short circuit between the adjacent connection pads 5a due to the solder, and hence the solder bumps 110 can be formed properly on the individual connection pads 5a. This ensures the electrical connection between the electrode terminals 101a of the semiconductor integrated circuit element 101 arranged at a narrow pitch, and the connection pads 5a corresponding thereto. Even for the narrow-pitched connection pads 5a, the individual connection pads 5a can be exposed with high position accuracy because the solder resist layer 6 has the slit-shaped openings 6a for collectively exposing the individual connection pads 5a.

In particular, the width W1 of each of these connection pads 5a is 25 μm or less, preferably 10 to 25 μm, and the interval W2 of the adjacent connection pads 5a is 25 μm or less, preferably 15 to 25 μm. Even when the connection pads 5a have this shape, no electrical short circuit due to the solder occurs between the adjacent connection pads 5a, and the solder bumps 110 can be formed properly on the individual connection pads 5a, because the solder resist layer 6 is deposited so as to fill up the space between the adjacent connection pads 5a exposed within the slit-shaped openings 6a.

As described above, in the solder resist layer 6 deposited so as to fill up the space between the adjacent connection pads 5a exposed within the slit-shaped openings 6a, the height of solder resist layers 61 extending over the space are required to be such a degree that the melted solder can be rejected even if it spreads over the space between the adjacent connection pads 5a. That is, the solder resist layers 61 may fill up the above-mentioned space, for example, at a height below the upper surfaces of the connection pad 5a, or at a height exceeding the upper surfaces of the connection pad 5a. Preferably, the height of the solder resist layers 61 is substantially the same as the height of the connection pad 5a (within 2 μm in height difference). Although no special limitation is imposed on the height of the connection pad 5a, in general, it may be approximately 10 to 20 μm.

Next, the method of manufacturing the wiring board according to the first preferred embodiment will be described in detail with reference to the accompanying drawings, by illustrating the formation of the above-mentioned first wiring pattern portions 5A and the solder resist layer 6.

Figure 4:
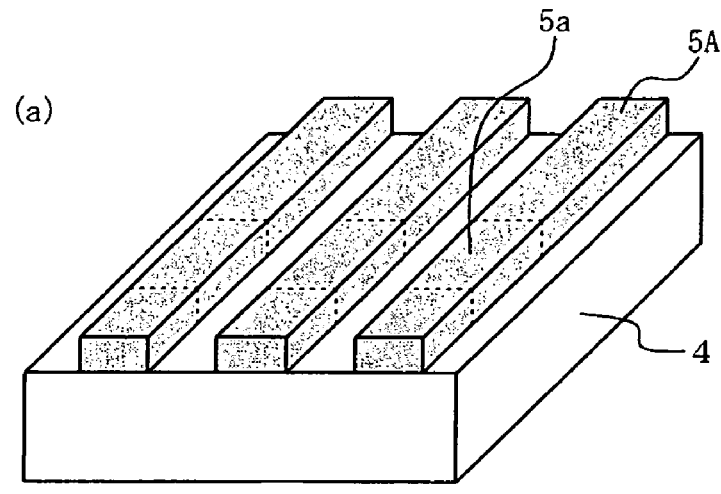
FIGS. 4(a) to 4(c) are partially enlarged process drawings showing a method of manufacturing the wiring board of the first preferred embodiment.
Figure 4:
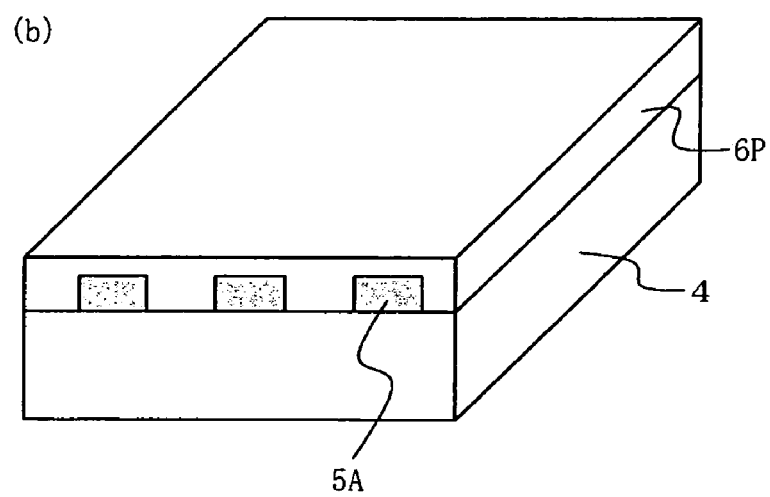
Figure 4:
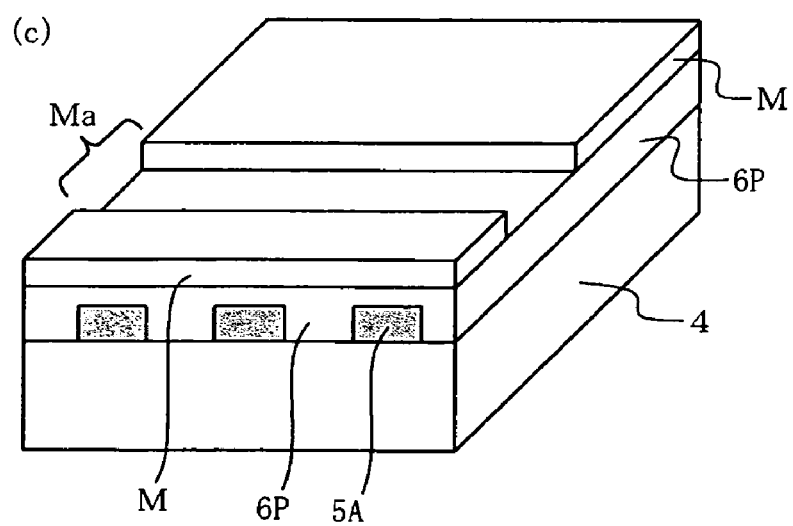

As shown in FIG. 4(*a*), firstly, insulation layers and wiring conductors are laminated alternately and then a plurality of first wiring pattern portions 5A are formed on the surface of the outermost buildup insulation layer 4. These first wiring pattern portions 5A are arranged side by side in the shape of a strip at a pitch of, for example, 50 μm. The width of each of these first wiring pattern portions 5A and the space therebetween are, for example, 25 μm, and the height thereof is, for example, approximately 13 μm. Each of the first wiring pattern portions 5A partly has the connection pad 5*a*. These first wiring pattern portions 5A can be formed by known semi-additive method.

As shown in FIG. 4(*b*), a resin layer 6P for a solder resist layer 6 is formed over the entire upper surfaces of the outermost buildup insulation layer 4 and the first wiring pattern portions 5A. As the resin layer 6P, various types of known resins can be employed which function as the solder resist layer 6 for protecting the surface of a wiring board. Examples thereof include photosensitive resin composed of an insulation material made by dispersing approximately 30 to 70% by mass of inorganic powder filler, such as silicon oxide or talc, into epoxy resin, and thermosetting resin. After resin paste that becomes the resin layer 6P is applied by screen printing method or the like, onto the outermost buildup insulation layer 4 provided with the first wiring pattern portions 5A, the resin paste may be cured by heating and UV irradiation under suitable conditions.

As shown in FIG. 4(*c*), a mask M having a slit-shaped opening Ma is formed at a location corresponding to the individual connection pads 5*a*, on the resin layer 6P. The mask M is composed of, for example, a photosensitive resin film. The opening Ma can be formed by laminating the mask M over the resin layer 6P, and applying exposure and development to the photosensitive resin film into a predetermined pattern.

Figure 5:
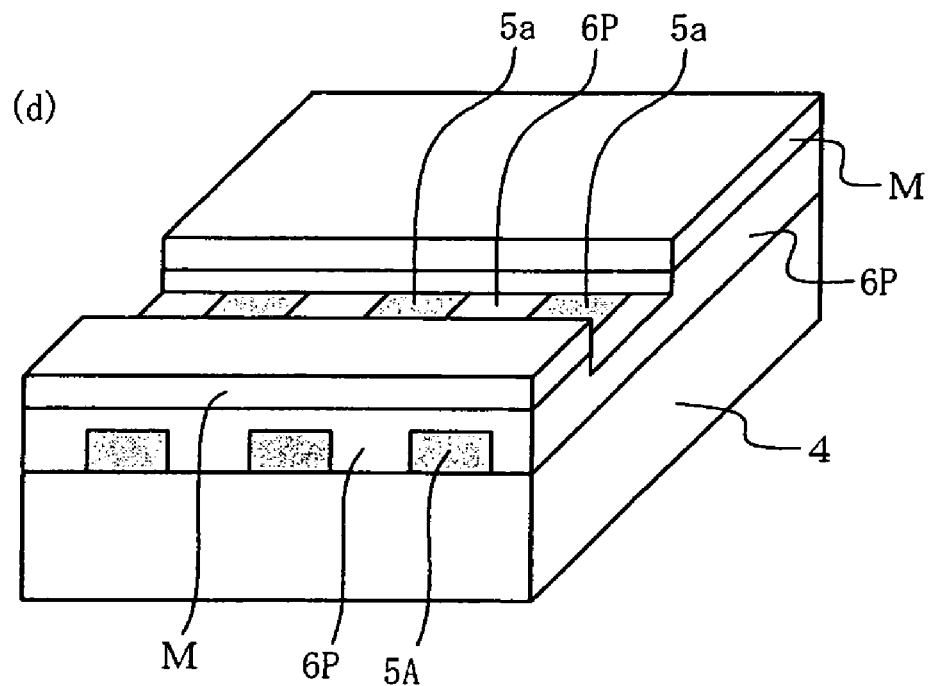
FIGS. 5(d) and 5(e) are partially enlarged process drawings showing the method of manufacturing the wiring board of the first preferred embodiment.
Figure 5:
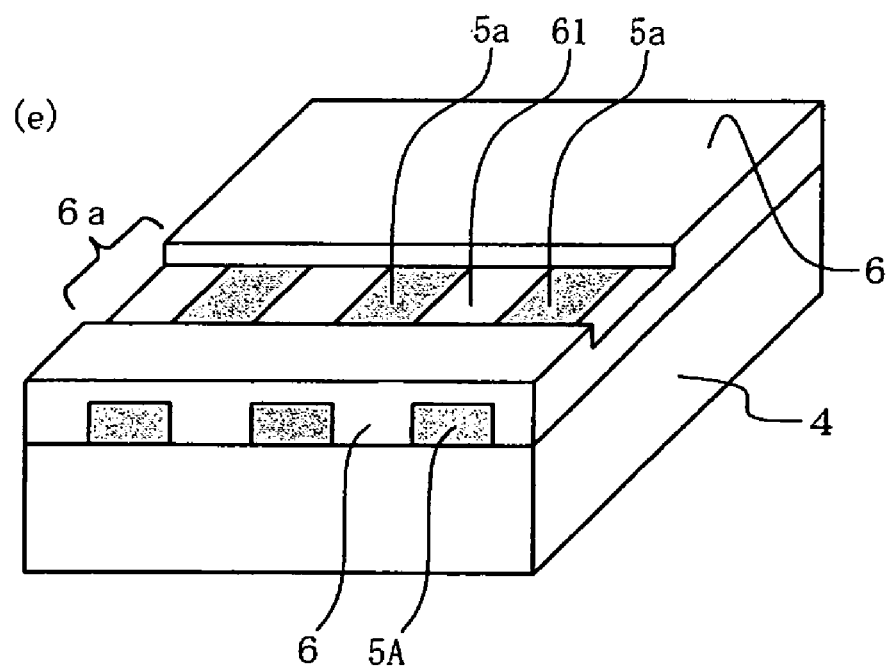

As shown in FIG. 5(*d*), the resin layer 6P exposed from the opening Ma of the mask M is partially removed so that the upper surfaces of the connection pads 5*a* are exposed and the resin layer 6P remains between the adjacent connection pads 5*a*. Although no special limitation is imposed on the method of removing the resin layer 6P, for example, wet blast method may be employed.

As shown in FIG. 5(*e*), the mask M is finally removed to form, on the buildup insulation layer 4 and the first wiring pattern portions 5A, the solder resist layer 6 having the slit-shaped openings 6*a* for exposing the upper surfaces of the connection pads 5*a*, and the solder resist layer 61 deposited so as to fill up the spaces between the adjacent connection pads 5*a* exposed within the slit-shaped openings 6*a*.

As the method of removing the mask M, there is, for example, immersion into an alkalescent solution such as sodium hydroxide solution.

Next, other method of manufacturing the wiring board according to the first preferred embodiment will be described in detail with reference to the accompanying drawings. The same references have been retained as in FIGS. 1 to 5(*e*) for similar components, and the description thereof is omitted here.

Figure 6:
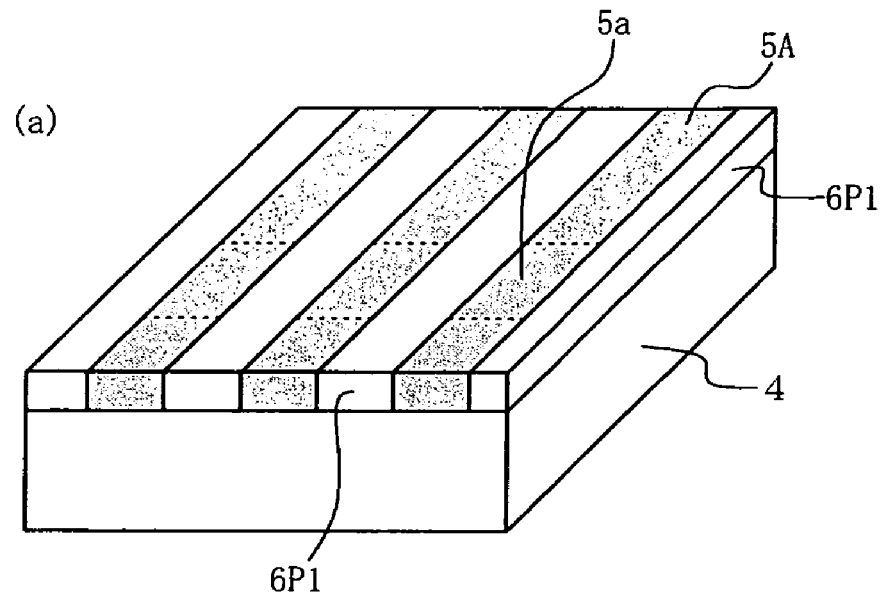
FIGS. 6(a) and 6(b) are partially enlarged explanatory drawings showing other method of manufacturing the wiring board of the first preferred embodiment.
Figure 6:
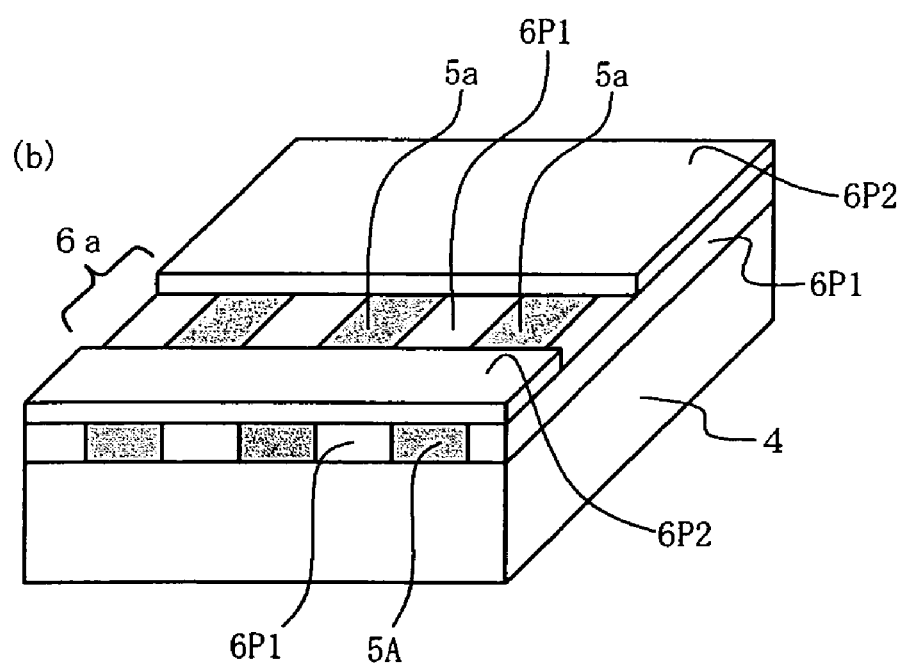

As shown in FIG. 6(*a*), similarly to the above-mentioned method, first wiring pattern portions 5A are firstly formed on the outermost buildup insulation layer 4. Subsequently, a cured first resin layer 6P1 for a solder resist layer 6 is formed over the entire upper surfaces of the outermost buildup insulation layer 4 and the first wiring pattern portions 5A. The first resin layer 6P1 is partially removed by wet blast method or the like so that the upper surfaces of the first wiring pattern portions 5A are exposed and the first resin layer 6P1 remains between the adjacent first wiring pattern portions 5A.

As shown in FIG. 6(*b*), a second resin layer 6P2 for the solder resist layer 6 is formed on the first resin layer 6P1 so as to have slit-shaped openings 6*a* for exposing the individual connection pads 5*a* and the first resin layer 6P1 remaining between the adjacent connection pads 5*a*. The second resin layer 6P2 is composed of photosensitive resin paste or film. The slit-shaped openings 6*a* can be formed by depositing the second resin layer 6P2 on the first resin layer 6P1, and applying exposure and development to the second resin layer 6P2 into a predetermined pattern.

Finally, the second resin layer 6P2 is cured to form the solder resist layer 6 over the surfaces of the buildup insulation layer 4 and the first wiring pattern portions 5A. The solder resist layer 6 is deposited so as to have the slit-shaped openings 6*a* for exposing the upper surfaces of the connection pads 5*a*, and fill up the space between the adjacent connection pads 5*a* exposed within the slit-shaped openings 6*a*.

Next, the wiring board and the manufacturing method thereof according to a second preferred embodiment of the invention will be described in detail with reference to the accompanying drawings. The same references have been retained as in FIGS. 1 to 6B for similar components, and the description thereof is omitted here.

Figure 7:
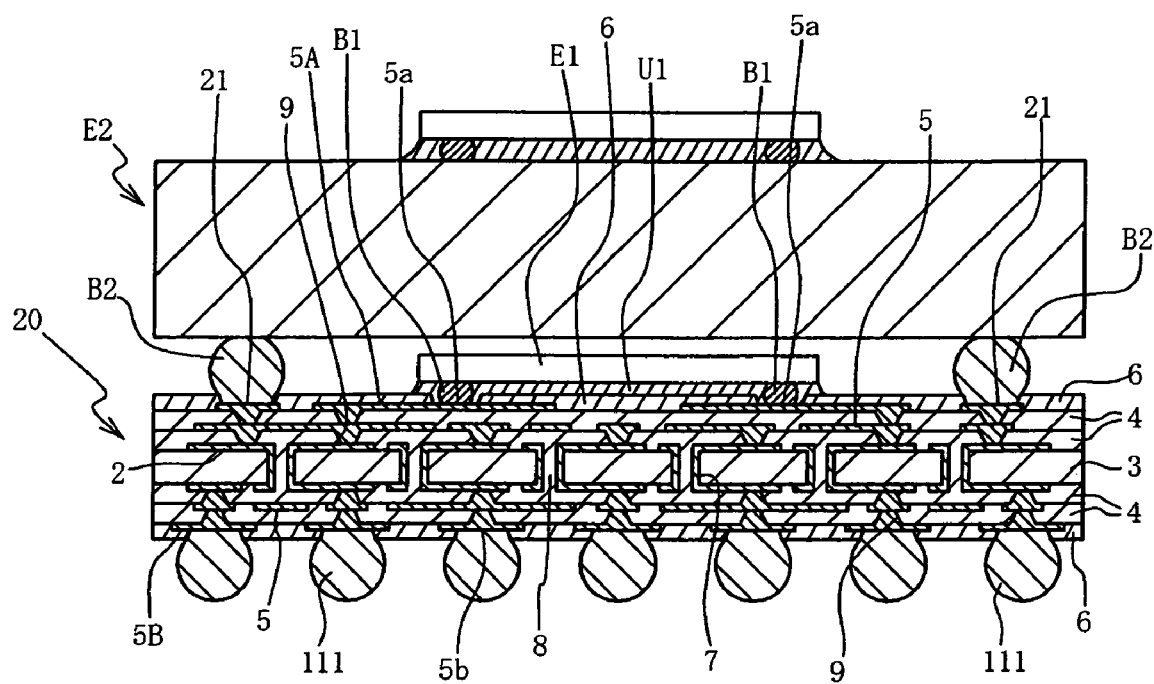
FIG. 7 is a schematic sectional view of a wiring board according to a second preferred embodiment of the invention.

As shown in FIG. 7, the wiring board 20 has connection pads 5*a* at portions of a wiring conductor 5 which are deposited over the outermost buildup insulation layer 4 on the upper side of the wiring board 20 (namely, first wiring pattern portions 5A). The connection pads 5*a* are electrically connected to the electrodes of a semiconductor integrated circuit element E1 through conductive bumps B1 such as solder. Further, the wiring board 20 has, at other portions thereof, connection portions 21 electrically connected by solder ball connection to the electrode terminals of a semiconductor element mounting board E2 through solder balls B2.

Similarly to the first preferred embodiment, the solder resist layer 6 on the upper side has slit-shaped openings for collectively exposing the connection pads 5*a*, and the solder resist layer 6 is deposited so as to fill up the space between the adjacent connection pads 5*a* exposed within the slit-shaped openings. The solder resist layer 6 is further provided with openings for exposing the upper surfaces of the individual connection portions 21, and the solder resist layer 6 is deposited so that the upper surfaces of the individual connection portions 21 are exposed from these openings. That is, in the wiring board 20, a plurality of buildup wiring conductors 5 having the connection portions 21 are arranged side by side, and these connection portions 21 are independently exposed from the openings of the solder resist layer 6.

In the wiring board 20 thus configured, firstly, the electrode terminals of the semiconductor integrated circuit element E1 and the connection pads 5*a* are electrically connected to each other through the conductive bumps B1. Subsequently, the semiconductor integrated circuit element E1 is mounted on the wiring board 20 by applying under fill resin U1, composed of thermosetting resin such as epoxy resin, into the space between the semiconductor integrated circuit element E1 and the wiring board 20. Further, the electrode terminals of the semiconductor element-mounting board E2 and the connection portions 21 are electrically connected to each other through the solder balls B2. As a result, the semiconductor element-mounting board E2 is mounted on the wiring board 20, enabling a high-density mounting of a plurality of electric components on the wiring board 20. Instead of the solder balls B2, wire bond connection may be employed to connect the electrode terminals of the semiconductor element-mounting board E2 and the connection portions 21.

Next, the method of manufacturing the wiring board according to the second preferred embodiment will be described in detail with reference to the accompanying drawings. The same references have been retained as in FIGS. 1 to 7 for similar components, and the description thereof is omitted here.

Figure 8:
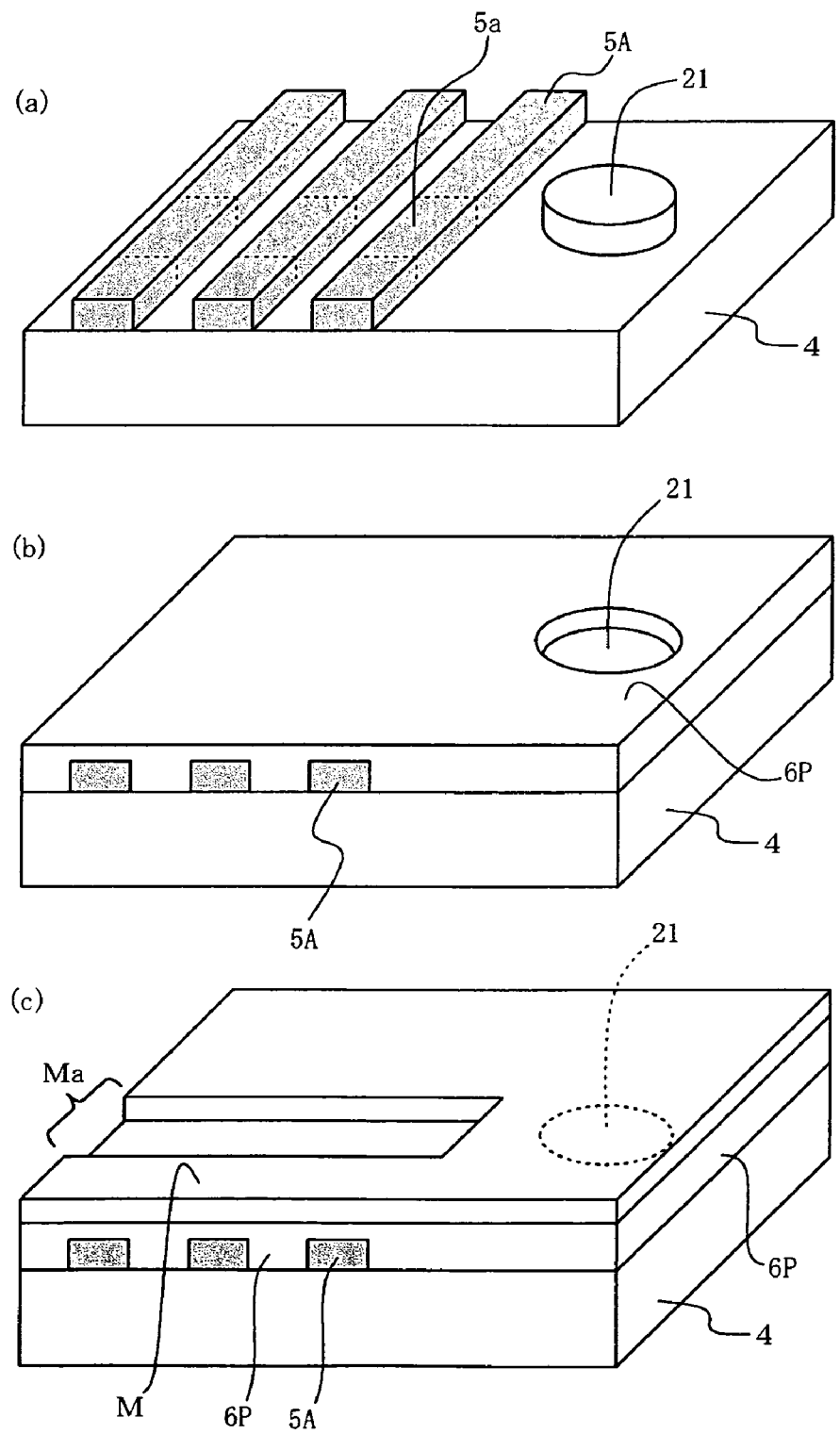
FIGS. 8(a) to 8(c) are partially enlarged process drawings showing a method of manufacturing the wiring board of the second preferred embodiment.

As shown in FIG. 8(a), firstly, first wiring pattern portions 5A and a circular connection portion 21 are formed on the surface of the outermost buildup insulation layer 4. The first wiring pattern portions 5A and the circular connection portion 21 can be formed by, for example, the above-mentioned semi-additive method.

As shown in FIG. 8(b), a resin layer 6P for a solder resist layer 6 is formed over the entire upper surfaces of the outermost buildup insulation layer 4, the first wiring pattern portions 5A and the connection portion 21. Specifically, resin paste that becomes the resin layer 6P is applied by screen printing method onto the uppermost buildup insulation layer 4 provided with the first wiring pattern portions 5A and the connection portion 21. Thereafter, the resin paste is cured by exposure and development under suitable conditions, followed by heating. At this time, an opening for exposing the upper surface of the connection portion 21 is formed.

Figure 9:
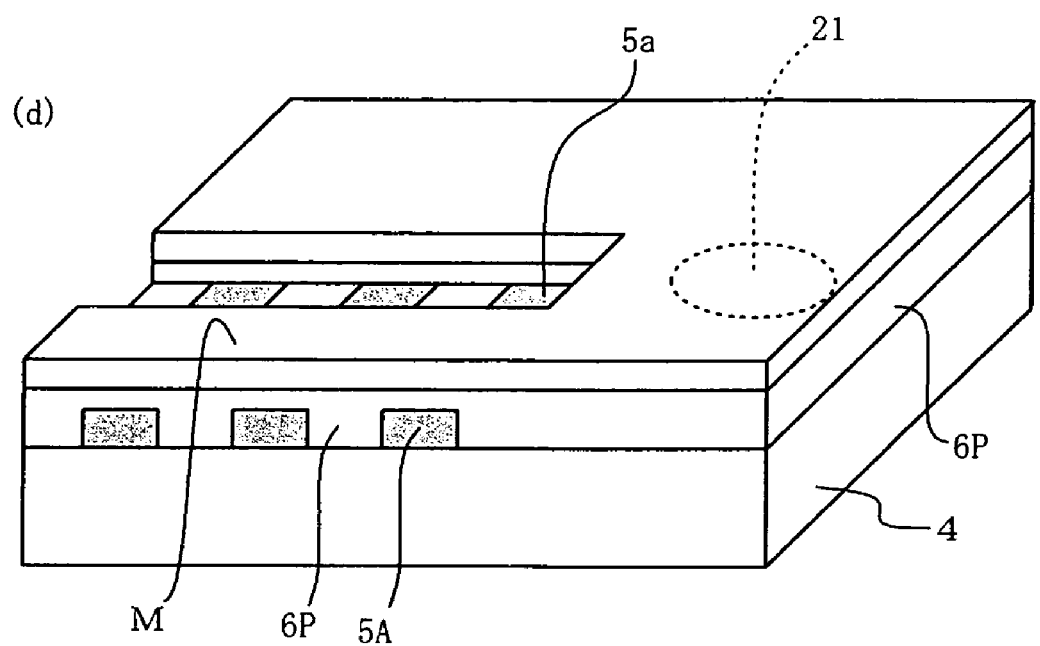
FIGS. 9(d) and 9(e) are partially enlarged process drawings showing the method of manufacturing the wiring board of the second preferred embodiment.
Figure 9:
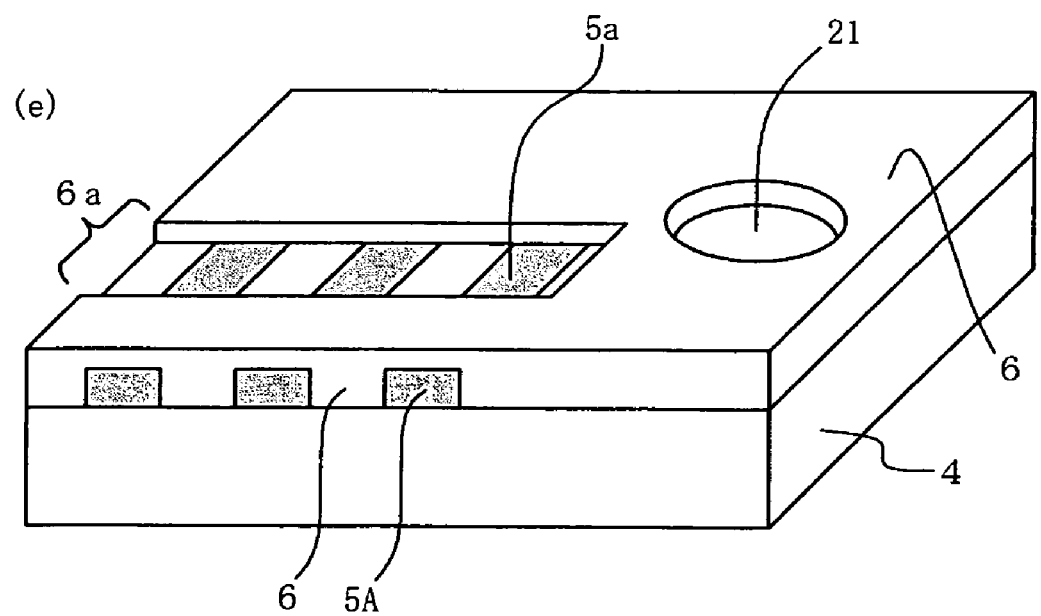

As shown in FIG. 8(c), a mask M having a slit-shaped opening Ma is formed at a location corresponding to the individual connection pads 5a, on the resin layer 6P and the connection portion 21. Thereafter, as shown in FIG. 9(d), the resin layer 6P exposed from the opening Ma of the mask M is partially removed so that the upper surfaces of the connection pads 5a are exposed and the resin layer 6P remains between the adjacent connection pads 5a.

As shown in FIG. 9(e), finally, the mask M is removed to cure the resin layer 6P, thereby forming the solder resist layer 6 extending over the buildup insulation layer 4, the first wiring pattern portions 5A and the connection portion 21. The solder resist layer 6 is deposited so as to have the slit-shaped openings 6a for exposing the upper surfaces of the connection pads 5a, and the circular opening for exposing the upper surface of the connection portion 21, and fill up the space between the adjacent connection pads 5a exposed within the slit-shaped openings 6a.

Next, other method of manufacturing the wiring board according to the second preferred embodiment will be described in detail with reference to the accompanying drawings. The same references have been retained as in FIGS. 1 to 9(e) for similar components, and the description thereof is omitted here.

Figure 10:
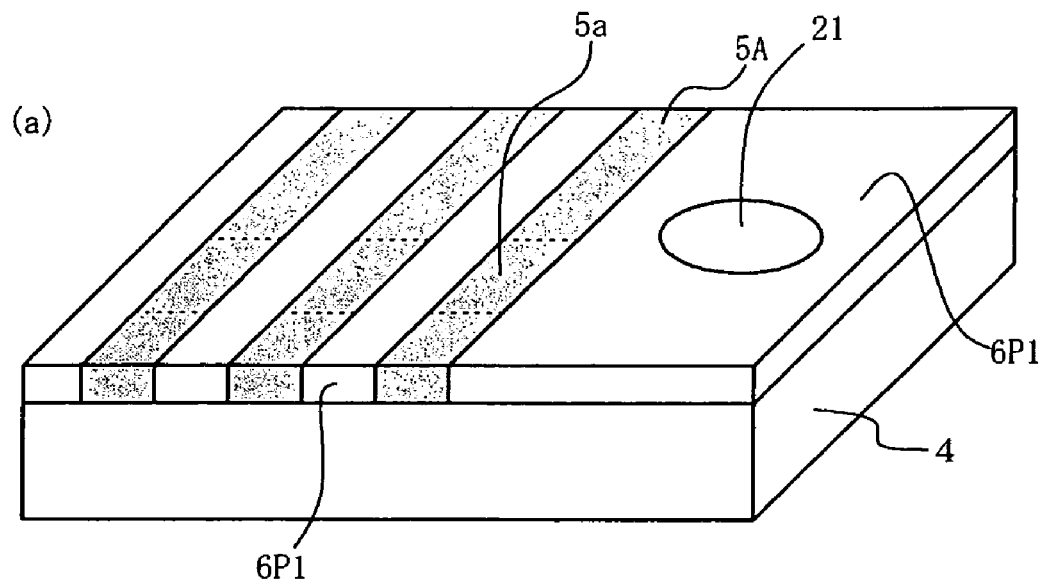
FIGS. 10(a) and 10(b) are partially enlarged explanatory drawings showing other method of manufacturing the wiring board of the second preferred embodiment.
Figure 10:
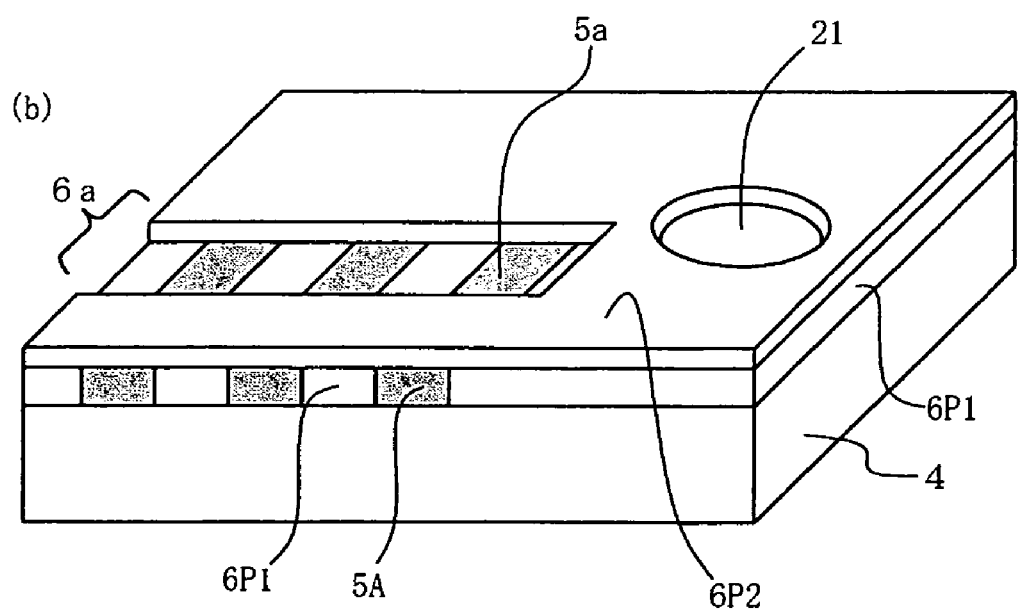

As shown in FIG. 10(a), first wiring pattern portions 5A and a connection portion 21 are firstly formed on the outermost buildup insulation layer 4. Subsequently, a first resin layer 6P1 for a solder resist layer 6 is formed over the entire upper surfaces of the outermost buildup insulation layer 4, the first wiring pattern portions 5A and the connection portion 21. The first resin layer 6P1 is then partially removed by wet blast method or the like so that the upper surfaces of the first wiring pattern portions 5A and the connection portion 21 are exposed, and the first resin layer 6P1 remains between the adjacent first wiring pattern portions 5A.

As shown in FIG. 10(b), a second resin layer 6P2 for the solder resist layer 6 is formed on the first resin layer 6P1 so as to have slit-shaped openings 6a for exposing the individual connection pads 5a and the first resin layer 6P1 remaining between the adjacent connection pads 5a, and an opening for exposing the connection portion 21. As described above, the second resin layer 6P2 is composed of photosensitive resin paste or film. The slit-shaped openings 6a and the opening for exposing the connection portion 21 can be formed by depositing the second resin layer 6P2 over the first resin layer 6P1, and applying exposure and development to the second resin layer 6P2 into a predetermined pattern.

Finally, the first resin layer 6P1 and the second resin layer 6P2 are cured to form the solder resist layer 6 extending over the buildup insulation layer 4, the first wiring pattern portions 5A and the connection portion 21. The solder resist layer 6 is deposited so as to have the slit-shaped openings 6a for exposing the upper surfaces of the connection pads 5a, and the opening for exposing the upper surface of the connection portion 21, and fill up the space between the adjacent connection pads 5a exposed within the slit-shaped openings 6a.

Figure 11:
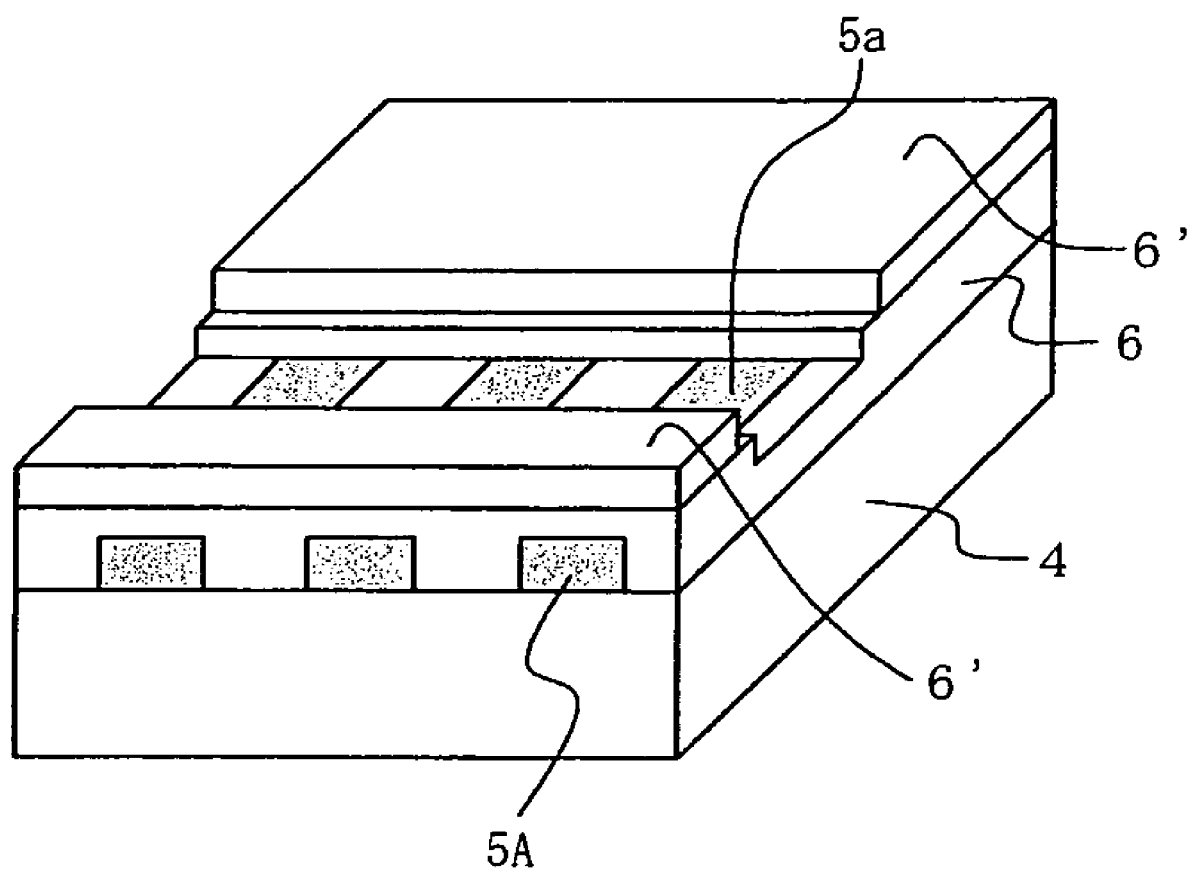
FIG. 11 is a partially enlarged schematic explanatory drawing showing the vicinity of connection pads of a wiring board according to a third preferred embodiment.
Figure 12:
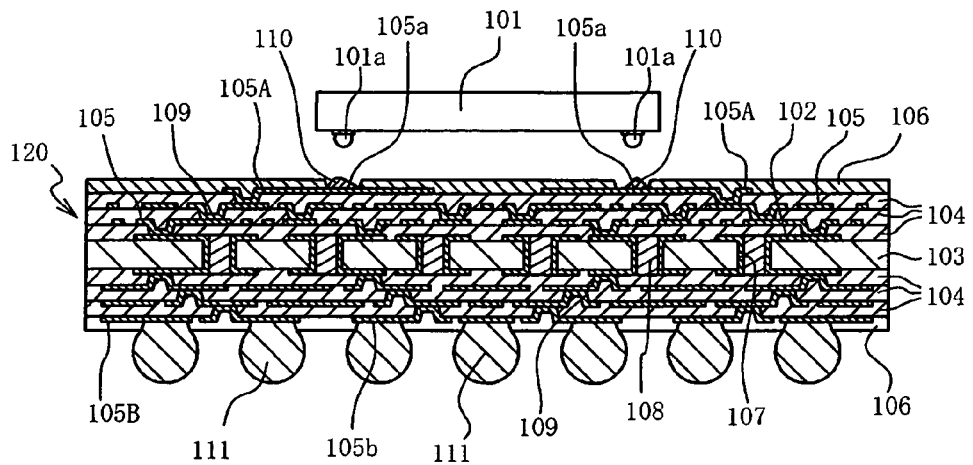
FIG. 12 is a schematic sectional view of a wiring board of related art.
Figure 13:
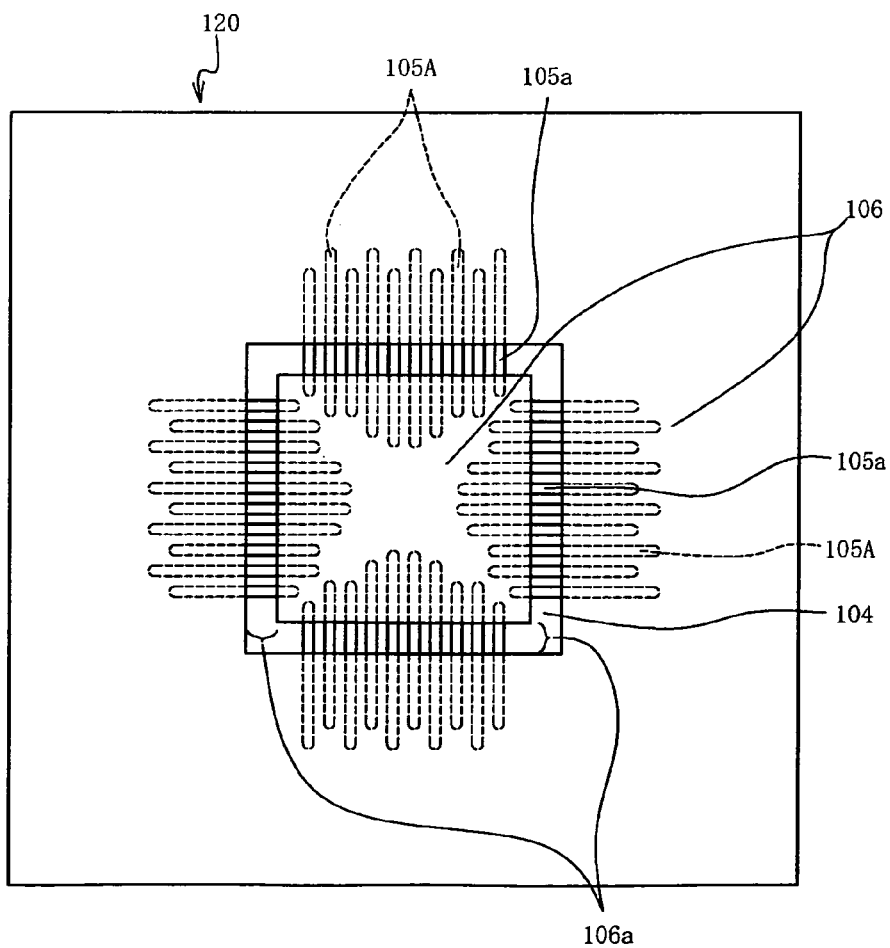
FIG. 13 is a plan view of the wiring board of FIG. 12.
Figure 14:
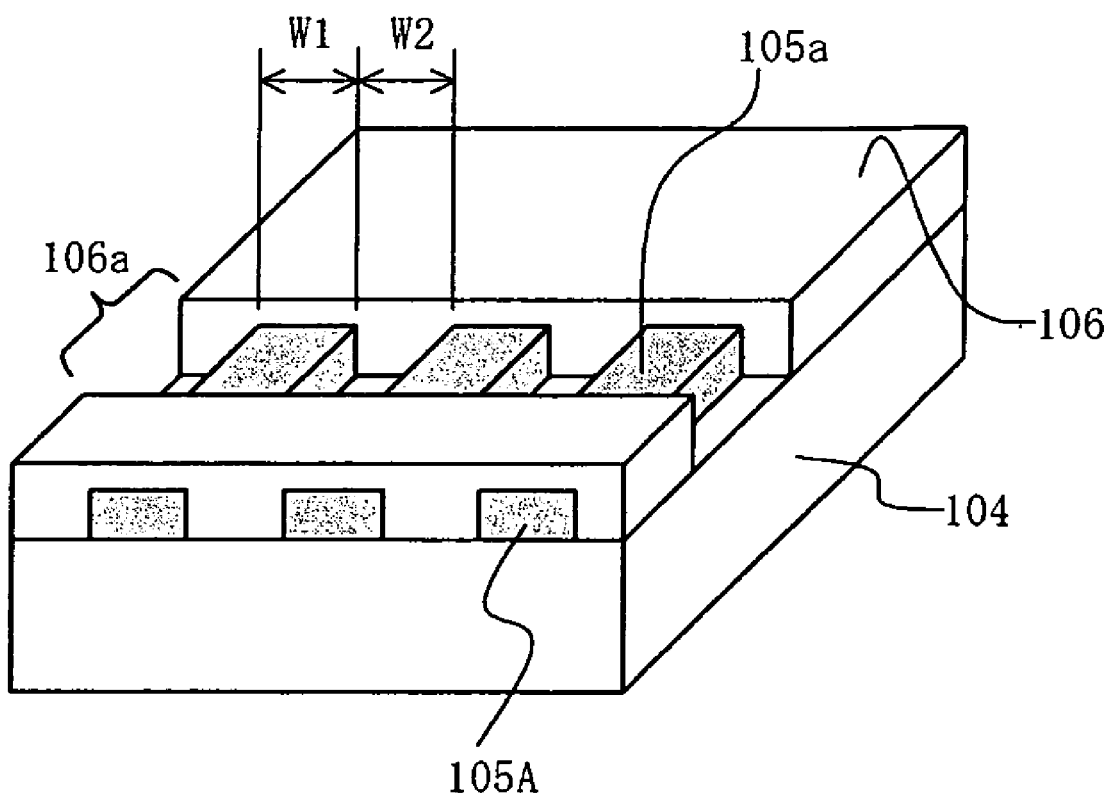
FIG. 14 is a partially enlarged schematic explanatory drawing showing the vicinity of connection pads of the wiring board of related art.

While preferred embodiments of the present invention have been described and illustrated above, it is to be understood that they are exemplary of the invention and are not to be considered to be limiting. Additions, omissions, substitutions, and other modifications can be made thereto without departing from the spirit or scope of the present invention. For example, as shown in FIG. 11, other solder resist layer 6' may be further formed by deposition on the solder resist layer 6. This enables to improve the function as the solder resist layer, namely the function of protecting the surface of the wiring board.

What is claimed is:

1. A wiring board comprising:
    alternately laminated insulation layers and wiring conductors;
    a plurality of strip-shaped wiring conductors for connecting semiconductor elements, arranged side by side on an outermost insulation layer, which is at a top side of the wiring board, each wiring conductor partly having a connection pad to which electrode terminals of one of the semiconductor elements are connected by flip-chip bonding; and
    a solder resist layer deposited over the outermost insulation layer and the strip-shaped wiring conductors so as to have slit-shaped openings for exposing upper surfaces of the connection pads, wherein
    the solder resist layer fills up a space between the connection pads adjacent to each other and exposed within the slit-shaped openings.

2. The wiring board according to claim 1, wherein a width of each of the connection pads is 25 μm or less, and the space between the adjacent connection pads is 25 μm or less.

3. The wiring board according to claim 1, further having, on the outermost insulation layer, a plurality of side-by-side arranged wiring conductors having connection portions to which electrode terminals of another one of the semiconductor elements are connected by either one of a solder ball connection and a wire bond connection, the connection portions being independently exposed from the openings of the solder resist layer, wherein the plurality of strip-shaped conductors having the connection pads and the wiring conductors having connection portions are disposed on a same side of the outermost insulation layer.

4. The wiring board according to claim 2, further having, on the outermost insulation layer, a plurality of side-by-side arranged wiring conductors having connection portions to which electrode terminals of another one of the semiconductor elements are connected by either one of a solder ball connection and a wire bond connection, the connection portions being independently exposed from the openings of the solder resist layer, wherein the plurality of strip-shaped conductors having the connection pads and the wiring conductors having connection portions are disposed on a same side of the outermost insulation layer.

* * * * *

US008304663C1

(12) EX PARTE REEXAMINATION CERTIFICATE (10206th)
United States Patent
Ohsumi

(10) Number: US 8,304,663 C1
(45) Certificate Issued: Jun. 26, 2014

(54) WIRING BOARD AND MANUFACTURING METHOD THEREOF

(75) Inventor: Kohichi Ohsumi, Yasu (JP)

(73) Assignee: Kyocera SLC Technologies Corporation, Ichimiyake, Yasu-shi, Shiga (JP)

Reexamination Request:
No. 90/013,004, Sep. 24, 2013

Reexamination Certificate for:
| | |
|---|---|
| Patent No.: | 8,304,663 |
| Issued: | Nov. 6, 2012 |
| Appl. No.: | 12/155,151 |
| Filed: | May 30, 2008 |

(30) Foreign Application Priority Data

May 31, 2007 (JP) ................. 2007-146108

(51) Int. Cl.
*H05K 1/16* (2006.01)

(52) U.S. Cl.
USPC .......................... 174/260; 174/263

(58) Field of Classification Search
None
See application file for complete search history.

(56) References Cited

To view the complete listing of prior art documents cited during the proceeding for Reexamination Control Number 90/013,004, please refer to the USPTO's public Patent Application Information Retrieval (PAIR) system under the Display References tab.

*Primary Examiner* — James Menefee

(57) ABSTRACT

In a wiring board, insulation layers and wiring conductors are alternately laminated, and a plurality of strip-shaped wiring conductors for connecting semiconductor elements are arranged side by side on the outermost insulation layer. Each of the wiring conductors partly has a connection pad to which the electrode terminals of the semiconductor elements are connected by flip-chip bonding. In the wiring board, a solder resist layer is deposited over the outermost insulation layer and the strip-shaped wiring conductors so as to have slit-shaped openings for exposing the upper surfaces of the connection pads. The solder resist layer fills up the space between the connection pads adjacent to each other and exposed within the slit-shaped openings.

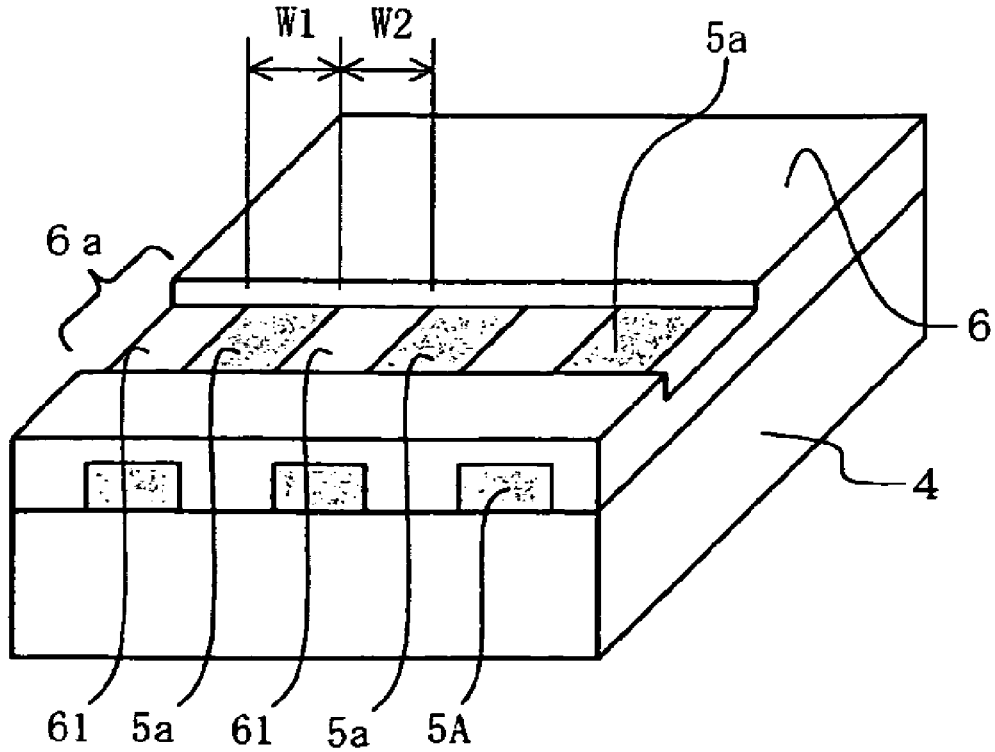

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1, 3 and 4 are determined to be patentable as amended.

Claim 2, dependent on an amended claim, is determined to be patentable.

1. A wiring board comprising:
   alternately laminated insulation layers and wiring conductors;
   a plurality of strip-shaped wiring conductors for connecting semiconductor elements, arranged side by side on an outermost insulation layer, which is at a top side of the wiring board, each wiring conductor partly having a connection pad to which electrode terminals of one of the semiconductor elements are connected by flip-chip bonding; and
   a solder resist layer deposited over the outermost insulation layer and the strip-shaped wiring conductors so as to have slit-shaped openings for exposing upper surfaces of the connection pads, wherein
   the solder resist layer fills up a space between the connection pads adjacent to each other and exposed within the slit-shaped openings *to be substantially the same height as the connection pads and flat.*

3. The wiring board according to claim 1, further having, on the outermost insulation layer, a plurality of side-by-side arranged wiring conductors having connection portions to which electrode terminals of another one of the semiconductor elements are connected by either one of a solder ball connection and a wire bond connection, the connection portions being independently *and individually* exposed from the openings of the solder resist layer, wherein the plurality of strip-shaped conductors having the connection pads and the wiring conductors having connection portions are disposed on a same side of the outermost insulation layer.

4. The wiring board according to claim 2, further having, on the outermost insulation layer, a plurality of side-by-side arranged wiring conductors having connection portions to which electrode terminals of another one of the semiconductor elements are connected by either one of a solder ball connection and a wire bond connection, the connection portions being independently *and individually* exposed from the openings of the solder resist layer, wherein the plurality of strip-shaped conductors having the connection pads and the wiring conductors having connection portions are disposed on a same side of the outermost insulation layer.

\* \* \* \* \*